United States Patent
Ogasawara et al.

(10) Patent No.: US 9,570,408 B2
(45) Date of Patent: Feb. 14, 2017

(54) RESIN-SEALED SEMICONDUCTOR DEVICE AND METHOD OF MANUFACTURING RESIN-SEALED SEMICONDUCTOR DEVICE

(75) Inventors: Atsushi Ogasawara, Hanno (JP); Koji Ito, Hanno (JP); Kazuhiko Ito, Hanno (JP); Koya Muyari, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/369,729

(22) PCT Filed: May 8, 2012

(86) PCT No.: PCT/JP2012/061776
§ 371 (c)(1),
(2), (4) Date: Jun. 30, 2014

(87) PCT Pub. No.: WO2013/168236
PCT Pub. Date: Nov. 14, 2013

(65) Prior Publication Data
US 2014/0361416 A1    Dec. 11, 2014

(51) Int. Cl.
*H01L 23/00* (2006.01)
*H01L 29/861* (2006.01)
(Continued)

(52) U.S. Cl.
CPC ............. *H01L 23/564* (2013.01); *C03C 3/085* (2013.01); *C03C 3/087* (2013.01); *C03C 3/093* (2013.01);
(Continued)

(58) Field of Classification Search
CPC ............. C03C 3/066; C03C 3/093; C03C 8/00; C03C 8/02; C03C 8/04; C03C 8/24; C03C 3/087
See application file for complete search history.

(56) References Cited

U.S. PATENT DOCUMENTS 3,355,291 A * 11/1967 Baird .................... C03C 4/02
257/794
3,392,312 A * 7/1968 Carman ...................... 257/794
(Continued)

FOREIGN PATENT DOCUMENTS

CN    1893006 A    1/2007
JP    5526656 A    2/1980
(Continued)

OTHER PUBLICATIONS

Office action for U.S. Appl. No. 13/582,215 dated Aug. 21, 2012.*
(Continued)

*Primary Examiner* — Dale E Page
*Assistant Examiner* — Vincent Wall
(74) *Attorney, Agent, or Firm* — Hauptman Ham, LLP

(57) ABSTRACT

A resin-sealed semiconductor device 10 of the present invention includes: a mesa-type semiconductor element 100 which includes a mesa-type semiconductor base body having a pn-junction exposure portion in an outer peripheral tapered region which surrounds a mesa region, and a glass layer which covers at least the outer peripheral tapered region; and a molding resin 40 which seals the mesa-type semiconductor element 100, wherein the mesa-type semiconductor element 100 includes a glass layer which substantially contains no Pb as the glass layer. The resin-sealed semiconductor device of the present invention can acquire higher resistance to a reverse bias at a high temperature than a conventional resin-sealed semiconductor device, although the resin-sealed semiconductor device of the present invention has the structure where the mesa-type semiconductor element is molded with a resin in the same manner as the conventional resin-sealed semiconductor device.

1 Claim, 11 Drawing Sheets

(51) Int. Cl.
| | |
|---|---|
| H01L 29/66 | (2006.01) |
| H01L 29/06 | (2006.01) |
| H01L 23/31 | (2006.01) |
| C03C 8/02 | (2006.01) |
| C03C 8/04 | (2006.01) |
| H01L 21/02 | (2006.01) |
| H01L 23/29 | (2006.01) |
| H01L 21/56 | (2006.01) |
| C03C 3/085 | (2006.01) |
| C03C 3/087 | (2006.01) |
| C03C 3/093 | (2006.01) |
| C03C 8/24 | (2006.01) |
| H01L 23/495 | (2006.01) |

(52) U.S. Cl.
CPC . *C03C 8/02* (2013.01); *C03C 8/04* (2013.01); *C03C 8/24* (2013.01); *H01L 21/02112* (2013.01); *H01L 21/02161* (2013.01); *H01L 21/02318* (2013.01); *H01L 21/56* (2013.01); *H01L 23/291* (2013.01); *H01L 23/3107* (2013.01); *H01L 23/3178* (2013.01); *H01L 29/0615* (2013.01); *H01L 29/0661* (2013.01); *H01L 29/66136* (2013.01); *H01L 29/861* (2013.01); *H01L 29/8613* (2013.01); *C03C 2207/00* (2013.01); *H01L 23/3171* (2013.01); *H01L 23/4952* (2013.01); *H01L 23/49551* (2013.01); *H01L 24/73* (2013.01); *H01L 2224/32245* (2013.01); *H01L 2224/45144* (2013.01); *H01L 2224/48091* (2013.01); *H01L 2224/48247* (2013.01); *H01L 2224/48472* (2013.01); *H01L 2224/73265* (2013.01); *H01L 2924/1301* (2013.01); *H01L 2924/1305* (2013.01); *H01L 2924/13055* (2013.01); *H01L 2924/13091* (2013.01)

(56) References Cited

U.S. PATENT DOCUMENTS

| | | | | |
|---|---|---|---|---|
| 4,199,364 | A * | 4/1980 | Neely | C03C 13/00 501/35 |
| 5,047,369 | A | 9/1991 | Fleming et al. | |
| 5,298,330 | A | 3/1994 | Stadnicar, Jr. et al. | |
| 5,882,986 | A | 3/1999 | Eng et al. | |
| 9,006,113 | B2 * | 4/2015 | Ogasawara | C03C 3/066 438/778 |
| 9,159,549 | B2 * | 10/2015 | Ogasawara | C03C 3/066 |
| 2004/0018931 | A1 | 1/2004 | Sridharan et al. | |
| 2007/0009744 | A1 | 1/2007 | Besinger et al. | |
| 2007/0154713 | A1 * | 7/2007 | Rosenflanz | C04B 35/119 428/408 |
| 2009/0109654 | A1 | 4/2009 | Fechner et al. | |
| 2011/0028300 | A1 * | 2/2011 | Zou | C03B 17/062 501/78 |
| 2011/0241043 | A1 * | 10/2011 | Nakayama | H01L 33/60 257/98 |
| 2012/0132282 | A1 * | 5/2012 | Aitken | C03C 3/062 136/260 |

FOREIGN PATENT DOCUMENTS

| | | | |
|---|---|---|---|
| JP | 5571646 A | 5/1980 | |
| JP | 57202742 A | 12/1982 | |
| JP | 5855345 A | 4/1983 | |
| JP | 2163938 A | 6/1990 | |
| JP | 10116828 A * | 5/1998 | |
| JP | 10294473 A | 11/1998 | |
| JP | 2002190553 A | 7/2002 | |
| JP | 2003267750 A | 9/2003 | |
| JP | 200487955 A | 3/2004 | |
| JP | 2005-525287 A | 8/2005 | |
| JP | 2005298259 A | 10/2005 | |
| JP | 2011-60857 A | 3/2011 | |
| JP | 2011153049 A | 8/2011 | |
| JP | WO 2012160962 A1 * | 11/2012 | C03C 3/087 |
| WO | 2012/160962 A1 | 11/2012 | |

OTHER PUBLICATIONS

Office action for U.S. Appl. No. 13/582,215 dated Nov. 20, 2014.*
Office action for U.S. Appl. No. 13/582,215 dated Nov. 7, 2013.*
International Search Report mailed Jul. 17, 2012, corresponds to PCT/JP2012/061776.
International Preliminary Report on Patentability dated Mar. 7, 2014, corresponds to PCT/JP2012/061776.
Extended European Search Report in EP Application No. 12876406.5, dated Jan. 7, 2016.

* cited by examiner

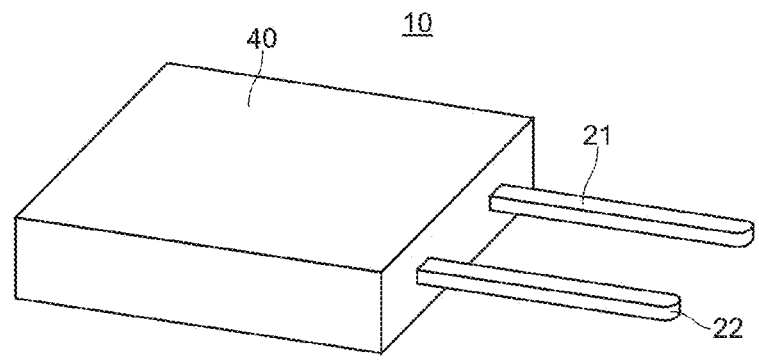
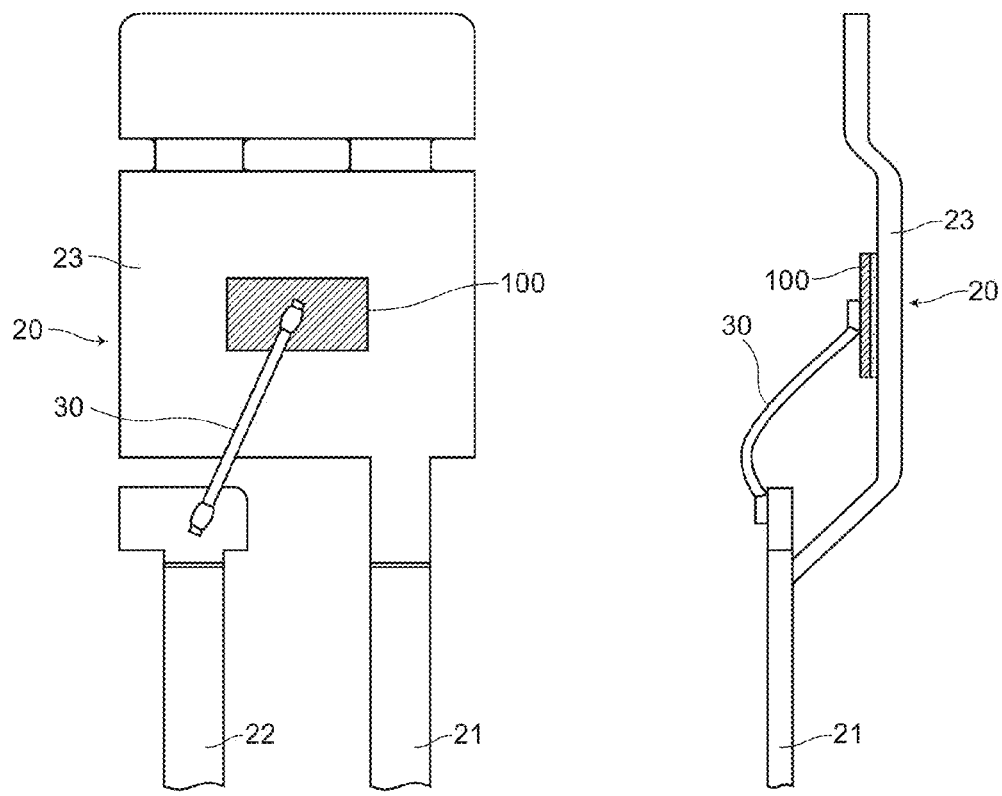
FIG.1A
FIG.1B  FIG.1C

| item | | | example 1 | example 2 | example 3 | example 4 | example 5 | example 6 | example 7 | example 8 | comparison example 1 | comparison example 2 |
|---|---|---|---|---|---|---|---|---|---|---|---|---|
| composition ratio (mol ratio) | $SiO_2$ | | 63.2 | 50.0 | 40.0 | 62.6 | 39.6 | 49.6 | 48.3 | 55.3 | 75.0 | 12.0 |
| | $B_2O_3$ | | 0 | 0 | 7.0 | 0.0 | 6.9 | 12.1 | 6.9 | 13.5 | 0 | 29.0 |
| | $Al_2O_3$ | | 15.5 | 10.0 | 11.0 | 15.3 | 10.9 | 12.4 | 11.1 | 13.8 | 5.0 | 0 |
| | ZnO | | 0 | 40.0 | 23.0 | 0.0 | 22.8 | 14.3 | 22.8 | 4.5 | 0 | 58.0 |
| | alkaline earth metal | CaO | 5.6 | 0 | 19.0 | 5.5 | 18.8 | 5.5 | 5.0 | 7.3 | 0 | 0 |
| | | MgO | 15.7 | 0 | 0 | 15.6 | 0 | 2.2 | 2.0 | 0 | 0 | 0 |
| | | BaO | 0 | 0 | 0 | 0 | 0 | 3.3 | 3.0 | 5.0 | 0 | 0 |
| | NiO | | 0 | 0 | 0 | 1.0 | 1.0 | 0.6 | 1.0 | 0.6 | 0 | 0 |
| | PbO | | 0 | 0 | 0 | 0 | 0 | 0 | 0 | 0 | 20.0 | 0 |
| | other components | | 0 | 0 | 0 | 0 | 0 | 0 | 0 | 0 | 0 | 1.0 |
| | total | | 100 | 100 | 100 | 100 | 100 | 100 | 100 | 100 | 100 | 100 |
| evaluation item 1 (baking temperature) | | | good | good | good | good | good | good | good | good | good | good |
| evaluation item 2 (resistance to chemicals) | | | good | good | good | good | good | good | good | good | good | bad |
| evaluation item 3 (average linear expansion coefficient) | | | good | good | good | good | good | good | good | good | good | good |
| evaluation item 4 (insulation property) | | | good | good | good | good | good | good | good | good | good | good |
| evaluation item 5 (presence or non-presence of crystallization) | | | good | good | good | good | good | good | good | good | good | good |
| evaluation item 6 (presence or non-presence of generation of bubbles) | | | good | good | good | good | good | good | good | good | bad | good |
| evaluation item 7 (resistance to reverse bias at high temperature) | | | good | good | good | good | good | good | good | good | bad | good |
| comprehensive evaluation | | | good | good | good | good | good | good | good | good | bad | bad |

FIG.9

RESIN-SEALED SEMICONDUCTOR DEVICE AND METHOD OF MANUFACTURING RESIN-SEALED SEMICONDUCTOR DEVICE

RELATED APPLICATIONS

The present application is a National Phase of International Application Number PCT/JP2012/061776, filed May 8, 2012.

TECHNICAL FIELD

The present invention relates to a resin-sealed semiconductor device and a method of manufacturing a resin-sealed semiconductor device.

BACKGROUND ART

Conventionally, there has been known a mesa-type semiconductor element having the structure where a pn junction is exposed on an outer peripheral tapered region which surrounds a mesa region (see patent literatures 1 and 2, for example). FIG. 14 is a view provided for explaining a conventional mesa-type semiconductor element 900.

The conventional mesa-type semiconductor element 900 includes, as shown in FIG. 14, a mesa-type semiconductor base body 908 having a pn junction exposure portion C in an outer peripheral tapered region B surrounding a mesa region A, and a glass layer 924 which covers at least the outer peripheral tapered region B. The glass layer 924 is a glass layer for passivation. In FIG. 14, symbol 910 indicates an $n^-$-type semiconductor layer, symbol 912 indicates a $p^+$-type semiconductor layer, symbol 914 indicates an $n^+$-type semiconductor layer, symbol 916a indicates a silicon oxide film, symbol 934 indicates an anode electrode layer, and symbol 936 indicates a cathode electrode layer.

PRIOR ART LITERATURE

Patent Literature

Patent literature 1: JP-A-10-116828
Patent literature 2: JP-A-2004-87955

SUMMARY OF THE INVENTION

Technical Problem

However, through studies made by inventors of the present invention, it has been clearly found that the conventional mesa-type semiconductor element 900 has a drawback that, in a resin-sealed semiconductor device manufactured by molding the mesa-type semiconductor element 900 with a resin (a conventional resin-sealed semiconductor device), resistance to a reverse bias at a high temperature which the mesa-type semiconductor element 900 has is lowered.

The present invention has been made to overcome the above-mentioned drawbacks, and it is an object of the present invention to provide a resin-sealed semiconductor device which is manufactured by molding a mesa-type semiconductor element with a resin and has higher resistance to a reverse bias at a high temperature than a conventional resin-sealed semiconductor device.

It is another object of the present invention to provide a method of manufacturing a resin-sealed semiconductor device by which such a resin-sealed semiconductor device can be manufactured.

Solution to Problem

The inventors of the present invention have extensively studied a cause which lowers resistance to a reverse bias at a high temperature when a resin-sealed semiconductor device is manufactured by molding a conventional mesa-type semiconductor element with a resin. As a result of the studies, the inventors have made the following finding as the cause of the lowering of resistance to a reverse bias at a high temperature. That is, lead-containing glass which constitutes a glass layer has a high dielectric constant and hence, large polarization is generated in the glass layer (see FIG. 3B described later). As a result, ions of high concentration are induced on an interface between a molded resin and the glass layer as well as on an interface between the glass layer and the semiconductor layer in the midst of performing a high-temperature reverse bias test. A channel formed of an inverted layer is formed on the interface between the glass layer and the semiconductor layer by being influenced by the induced ions and hence, a leakage current is increased.

In view of the above, based on such finding, the inventors of the present invention have arrived at an idea that, with the use of a glass layer made of lead-free glass (glass which contains no oxide of Pb) having a lower dielectric constant than lead-containing glass as a glass layer, there exists no possibility that ions of high concentration are induced on an interface between a molded resin and a glass layer as well as on an interface between the glass layer and a semiconductor layer in the midst of performing a high-temperature reverse bias test (see FIG. 3A described later) and, as a result, a leakage current which is increased during the high-temperature reverse bias test can be decreased compared to the prior art. The inventors of the present invention have completed the present invention based on such findings.

[1] According to one aspect of the present invention, there is provided a resin-sealed semiconductor device which includes: a mesa-type semiconductor element which includes a mesa-type semiconductor base body having a pn-junction exposure portion in an outer peripheral tapered region which surrounds a mesa region, and a glass layer which covers at least the outer peripheral tapered region; and a molding resin which seals the mesa-type semiconductor element, wherein the mesa-type semiconductor element includes a glass layer which substantially contains no Pb as the glass layer.

[2] In the resin-sealed semiconductor device according to the present invention, it is preferable that the outer peripheral tapered region is directly covered with the glass layer.

[3] In the resin-sealed semiconductor device according to the present invention, it is preferable that the outer peripheral tapered region is covered with the glass layer with an insulation layer interposed between the outer peripheral tapered region and the glass layer.

[4] In the resin-sealed semiconductor device according to the present invention, it is preferable that the glass layer is formed using a glass composition which substantially contains none of Pb, As, Sb, Li, Na and K.

[5] In the resin-sealed semiconductor device according to the present invention, it is preferable that the glass layer is formed using a glass composition which substantially contains none of Pb, P, As, Sb, Li, Na and K.

[6] In the resin-sealed semiconductor device according to the present invention, it is preferable that the glass composition contains at least $SiO_2$, $B_2O_3$, $Al_2O_3$, $ZnO$ and at least two oxides of alkaline earth metals selected from a group consisting of $CaO$, $MgO$ and $BaO$.

[7] In the resin-sealed semiconductor device according to the present invention, it is preferable that the glass composition contains at least $SiO_2$, $Al_2O_3$, ZnO, CaO, and 3 mol % to 10 mol % of $B_2O_3$.

[8] In the resin-sealed semiconductor device according to the present invention, it is preferable that the glass composition contains at least $SiO_2$, $Al_2O_3$, an oxide of alkaline earth metal, and at least one metal oxide selected from a group consisting of nickel oxide, copper oxide, manganese oxide, and zirconium oxide.

[9] In the resin-sealed semiconductor device according to the present invention, it is preferable that the glass layer is formed using a glass composition which substantially contains none of Pb, B, P, As, Sb, Li, Na and K.

[10] In the resin-sealed semiconductor device according to the present invention, it is preferable that the glass composition contains at least $SiO_2$, $Al_2O_3$, MgO and CaO.

[11] In the resin-sealed semiconductor device according to the present invention, it is preferable that the glass composition contains at least $SiO_2$, $Al_2O_3$ and ZnO.

[12] According to another aspect of the present invention, there is provided a method of manufacturing a resin-sealed semiconductor device, the method including, in the following order, the steps of: preparing a semiconductor substrate provided with a pn junction parallel to a main surface; forming a trench from one surface of the semiconductor substrate with a depth exceeding the pn junction; forming a glass layer such that the glass layer covers at least an inner surface of the trench; preparing mesa-type semiconductor elements by cutting the semiconductor substrate along the trench; and sealing the mesa-type semiconductor element with a molding resin, wherein the glass layer is formed using a glass composition which substantially contains no Pb in the step of forming a glass layer.

[13] In the method of manufacturing a resin-sealed semiconductor device according to the present invention, it is preferable that the step of forming a glass layer includes a step of forming a glass layer such that the glass layer directly covers an inner surface of the trench.

[14] In the method of manufacturing a resin-sealed semiconductor device according to the present invention, it is preferable that the step of forming a glass layer includes a step of forming an insulation layer on the inner surface of the trench, and a step of forming a glass layer such that the glass layer covers the inner surface of the trench with the insulation layer interposed therebetween.

[15] In the method of manufacturing a resin-sealed semiconductor device according to the present invention, it is preferable that in the step of forming a glass layer, the glass layer is formed using a glass composition which substantially contains none of Pb, As, Sb, Li, Na and K.

[16] In the method of manufacturing a resin-sealed semiconductor device according to the present invention, it is preferable that in the step of forming a glass layer, the glass layer is formed using a glass composition which substantially contains none of Pb, P, As, Sb, Li, Na and K.

[17] In the method of manufacturing a resin-sealed semiconductor device according to the present invention, it is preferable that the glass composition contains at least $SiO_2$, $B_2O_3$, $Al_2O_3$, ZnO and at least two oxides of alkaline earth metals selected from a group consisting of CaO, MgO and BaO.

[18] In the method of manufacturing a resin-sealed semiconductor device according to the present invention, it is preferable that the glass composition contains at least $SiO_2$, $Al_2O_3$, ZnO, CaO and 3 mol % to 10 mol % of $B_2O_3$.

[19] In the method of manufacturing a resin-sealed semiconductor device according to the present invention, it is preferable that the glass composition contains at least $SiO_2$, $Al_2O_3$, an oxide of alkaline earth metal, and at least one metal oxide selected from a group consisting of nickel oxide, copper oxide, manganese oxide, and zirconium oxide.

[20] In the method of manufacturing a resin-sealed semiconductor device according to the present invention, it is preferable that in the step of forming a glass layer, the glass layer is formed using a glass composition which substantially contains none of Pb, B, P, As, Sb, Li, Na and K.

[21] In the method of manufacturing a resin-sealed semiconductor device according to the present invention, it is preferable that the glass composition contains at least $SiO_2$, $Al_2O_3$, MgO and CaO.

[22] In the method of manufacturing a resin-sealed semiconductor device according to the present invention, it is preferable that the glass composition contains at least $SiO_2$, $Al_2O_3$ and ZnO.

Advantage of the Invention

According to the resin-sealed semiconductor device of the present invention, the mesa-type semiconductor element includes a glass layer made of lead-free glass (glass which contains no Pb) having a lower dielectric constant than lead-containing glass as the glass layer thereof and hence, there is no possibility that ions of high concentration are induced on an interface between a molded resin and the glass layer as well as on an interface between the glass layer and a semiconductor layer in the midst of performing a high-temperature reverse bias test (see FIG. 3 described later). As a result, a leakage current which is increased during the high-temperature reverse bias test can be decreased compared to the prior art.

As a result, the resin-sealed semiconductor device of the present invention can acquire higher resistance to a reverse bias at a high temperature than the conventional resin-sealed semiconductor device, although the resin-sealed semiconductor device of the present invention has the structure where the mesa-type semiconductor element is molded with a resin in the same manner as the conventional resin-sealed semiconductor device. That is, the resin-sealed semiconductor device of the present invention is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

To increase resistance to a reverse bias at a high temperature of the resin-sealed semiconductor device, it is also considered to adopt (1) a method of forming a trench having a large width (mesa trench) in a step of manufacturing a mesa-type semiconductor element, (2) a method of forming a deep trench (mesa trench) using a diffusion wafer in a step of manufacturing a mesa-type semiconductor element, and (3) a method using a wafer having low specific resistance, and (4) a method of forming a glass layer having a large thickness. However, the above-mentioned method (1) has a drawback that a manufacturing cost of a product is pushed up due to the increase of an area of a chip. The above-mentioned method (2) has a drawback that a manufacturing cost of a wafer is pushed up with the use of a diffusion wafer, and a drawback that it is necessary to form a deep trench or the like so that the step of forming a trench becomes difficult whereby a manufacturing cost of a product is pushed up. The above-mentioned method (3) has a drawback that it is difficult to ensure a reverse voltage. The above-mentioned method (4) has a drawback that warping or cracks are liable to occur in a wafer during a step. To the contrary, the resin-sealed semiconductor device of the present invention can obviate the above-mentioned drawbacks, and can increase resistance to a reverse bias at a high temperature.

According to the method of manufacturing a resin-sealed semiconductor device of the present invention, it is possible to manufacture an excellent resin-sealed semiconductor device having high resistance to a reverse bias at a high temperature as described above.

According to the method of manufacturing a resin-sealed semiconductor device of the present invention, as can be clearly understood from examples described later, it is possible to acquire the following advantageous effects (1) to (4) by using the glass composition which substantially contains no Pb in the same manner as the case where the conventional glass composition made of lead-containing glass is used.

(1) The glass composition can be baked at a proper temperature (for example, 1100° C. or below).
(2) The glass composition exhibits resistance to chemicals (for example, aqua regia or a plating liquid) used in a step.
(3) The glass composition has a linear expansion coefficient close to a linear expansion coefficient of silicon (particularly an average linear expansion coefficient of the glass composition at a temperature range of 50° C. to 550° C. being close to a linear expansion coefficient of silicon) and hence, the warping of a wafer in a step can be made extremely small.
(4) The manufactured glass layer has an excellent insulation property and hence, a resin-sealed semiconductor device having an excellent reverse breakdown voltage characteristic can be manufactured.

In the glass composition for protecting a semiconductor junction of the present invention, "to contain at least some specific components ($SiO_2$, $B_2O_3$ and the like)" means not only the case where the glass composition contains only such specific components but also the case where the glass composition further contains other components which can be usually contained in the glass composition besides such specific components.

In the glass composition for protecting a semiconductor junction of the present invention, "to substantially contain no specific element (Pb, As or the like)" means that the glass composition contains no any such a specific element as the specific component, and does not exclude the glass composition in which the above-mentioned specific element is mixed as an impurity in the raw materials which constitute respective components of glass. The same goes for the method of manufacturing a semiconductor device and the semiconductor device of the present invention.

When the glass composition for protecting a semiconductor junction is a so-called oxide-based glass composition as in the case of the present invention, "to substantially contain no specific element (Pb, As or the like)" means that the glass composition contains no oxide of the specific element, no nitride of the specific element or the like.

BRIEF DESCRIPTION OF THE DRAWINGS

FIG. 1A to FIG. 1C are views for explaining a resin-sealed semiconductor device of an embodiment 1;
FIG. 9 is a table showing conditions and results of examples.

MODE FOR CARRYING OUT THE INVENTION

Figure 2:
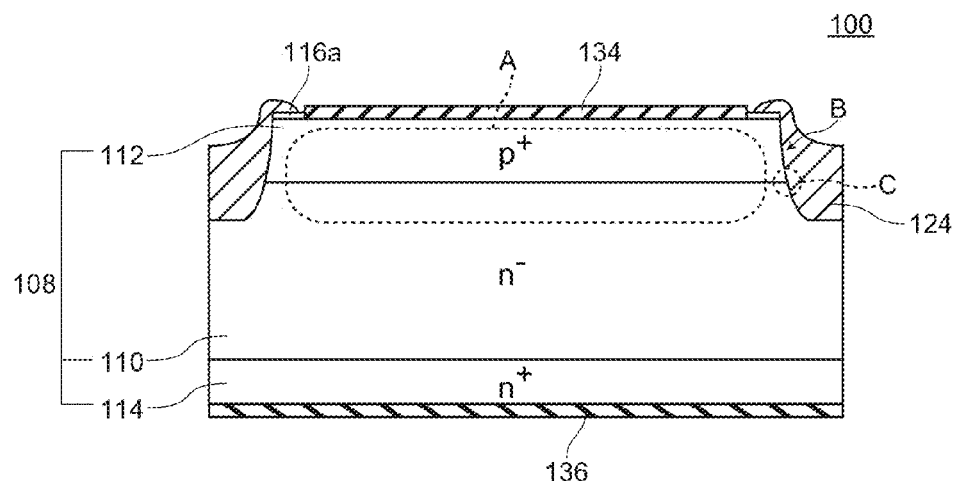
FIG. 2 is a view for explaining a mesa-type semiconductor element of the embodiment 1.

Hereinafter, a resin-sealed semiconductor device, and a method of manufacturing a resin-sealed semiconductor device according to the present invention are explained in conjunction with embodiments shown in the drawings.

Embodiment 1

1. Resin-Sealed Semiconductor Device

FIG. 1A to FIG. 1C are views for explaining a resin-sealed semiconductor device 10 of an embodiment 1. FIG. 1A is a perspective view of the resin-sealed semiconductor device 10, FIG. 1B is a plan view of the resin-sealed semiconductor device 10 in a state where a resin is removed from the resin-sealed semiconductor device 10, and FIG. 1C is a side view of the resin-sealed semiconductor device 10 in a state where a resin is removed from the resin-sealed semiconductor device 10.

FIG. 2 is a view for explaining a mesa-type semiconductor element 100 of the embodiment 1.

The resin-sealed semiconductor device 10 of the embodiment 1 includes, as shown in FIG. 1, the mesa-type semiconductor element 100, and a molding resin 40 which seals the mesa-type semiconductor element 100. The mesa-type semiconductor element 100 is mounted on a die pad 23 of a lead frame 20 which is constituted of a lead 21, a lead 22 and the die pad 23. One electrode of the mesa-type semiconductor element 100 is connected to the lead 21 via the die pad 23, and the other electrode of the mesa-type semiconductor element 100 is connected to the lead 22 via a gold wire 30.

As shown in FIG. 2, the mesa-type semiconductor element 100 includes a mesa-type semiconductor base body 108 having a pn-junction exposure portion C in an outer peripheral tapered region B which surrounds a mesa region A, and a glass layer 124 which covers at least the outer peripheral tapered region B. The outer peripheral tapered region B is directly covered with the glass layer 124.

The mesa-type semiconductor base body 108 includes an $n^-$-type semiconductor layer 110, a $p^+$-type semiconductor layer 112 which is formed by diffusion of a p-type impurity from one surface of the $n^-$-type semiconductor layer 110, and an $n^+$-type semiconductor layer 114 which is formed by diffusion of an n-type impurity from the other surface of the $n^-$-type semiconductor layer 110. The mesa-type semiconductor element 100 is a pn diode. In FIG. 2, symbol 134 indicates an anode electrode layer, and symbol 136 indicates a cathode electrode layer.

The resin-sealed semiconductor device 10 of the embodiment 1 is characterized in that the mesa-type semiconductor element 100 includes a glass layer which substantially contains no Pb as the glass layer 124. Such a glass layer may be formed using a glass composition which substantially contains none of Pb, As, Sb, Li, Na and K. As such a glass composition, a glass composition which substantially contains none of Pb, P, As, Sb, Li, Na and K (see Claim 5), and a glass composition which substantially contains none of Pb, B, P, As, Sb, Li, Na and K (see Claim 9) can preferably be exemplified.

The glass composition of the former case may be (1) a glass composition which contains at least $SiO_2$, $B_2O_3$, $Al_2O_3$, ZnO and at least two oxides of alkaline earth metals selected from a group consisting of CaO, MgO and BaO, (2) a glass composition which contains at least $SiO_2$, $Al_2O_3$, ZnO, CaO, and 3 mol % to 10 mol % of $B_2O_3$, or (3) a glass composition which contains at least $SiO_2$, $Al_2O_3$, an oxide of alkaline earth metal, and at least one metal oxide selected from a group consisting of nickel oxide, copper oxide, manganese oxide, and zirconium oxide.

The glass composition of the latter case may be (4) a glass composition which contains at least $SiO_2$, $Al_2O_3$, MgO and CaO, or (5) a glass composition which contains at least $SiO_2$, $Al_2O_3$ and ZnO.

In this case, "to contain some specific components" means not only the case where the glass composition contains only such specific components but also the case where the glass composition further contains other components which can be usually contained in the glass composition besides such specific components. Further, "to substantially contain no specific element" means that the glass composition contains no any such specific element as the component, and does not exclude the glass composition in which the above-mentioned specific element is mixed as an impurity in the raw materials which constitute respective components of glass. Further, "to contain no specific element" also means that the glass composition contains no oxide of the specific element, no nitride of the specific element or the like.

Out of these glass compositions, as the glass composition described in (1), it is possible to use, for example, a glass composition where the content of $SiO_2$ falls within a range of 41.1 mol % to 61.1 mol %, the content of $B_2O_3$ falls within a range of 5.8 mol % to 15.8 mol %, the content of $Al_2O_3$ falls within a range of 7.4 mol % to 17.4 mol %, the content of ZnO falls within a range of 3.0 mol % to 24.8 mol %, the content of the oxide of alkaline earth metal falls within a range of 5.5 mol % to 15.5 mol %, and the content of nickel oxide falls within a range of 0.01 mol % to 3.0 mol %.

In this case, it is possible to use a glass composition where, as the oxides of alkaline earth metals, the content of CaO falls within a range of 2.8 mol % to 7.8 mol %, the content of MgO falls within a range of 1.1 mol % to 3.1 mol %, and the content of BaO falls within a range of 1.7 mol % to 4.7 mol %.

It is also possible to use a glass composition where, as the oxides of alkaline earth metals, the content of CaO falls within a range of 3.8 mol % to 10.9 mol %, and the content of MgO falls within a range of 1.7 mol % to 4.7 mol %.

It is also possible to use a glass composition where, as the oxides of alkaline earth metals, the content of CaO falls within a range of 3.3 mol % to 9.3 mol %, and the content of BaO falls within a range of 2.2 mol % to 6.2 mol %.

It is also possible to use a glass composition where, as the oxides of alkaline earth metals, the content of MgO falls within a range of 2.2 mol % to 6.2 mol %, and the content of BaO falls within a range of 3.3 mol % to 9.3 mol %.

It is also possible to use a glass composition which contains no nickel oxide.

As the glass composition described in (2), it is possible to use, for example, a glass composition where the content of $SiO_2$ falls within a range of 32 mol % to 48 mol % (for example, 40 mol %), the content of $Al_2O_3$ falls within a range of 9 mol % to 13 mol % (for example, 11 mol %), the content of ZnO falls within a range of 18 mol % to 28 mol % (for example, 23 mol %), the content of CaO falls within a range of 15 mol % to 23 mol % (for example, 19 mol %), and the content of $B_2O_3$ falls within a range of 3 mol % to 10 mol % (for example, 7 mol %).

As the glass composition described in (3), it is possible to use, for example, a glass composition where the content of $SiO_2$ falls within a range of 53 mol % to 73 mol % (for example, 62.6 mol %), the content of $Al_2O_3$ falls within a range of 11 mol % to 21 mol % (for example, 15.3 mol %), the content of CaO falls within a range of 3 mol % to 9 mol % (for example, 5.5 mol %), the content of MgO falls within a range of 11 mol % to 21 mol % (for example, 15.6 mol %), and the content of nickel oxide falls within a range of 0.01 mol % to 3 mol % (for example, 1 mol %).

It is also possible to use a glass composition where the content of $SiO_2$ falls within a range of 32 mol % to 48 mol % (for example, 39.6 mol %), the content of $Al_2O_3$ falls within a range of 9 mol % to 13 mol % (for example, 10.9 mol %), the content of CaO falls within a range of 15 mol % to 23 mol % (for example, 18.8 mol %), the content of ZnO falls within a range of 18 mol % to 28 mol % (for example, 22.8 mol %), the content of $B_2O_3$ falls within a range of 3 mol % to 10 mol % (for example, 6.9 mol %), the content of nickel oxide falls within a range of 0.01 mol % to 3 mol % (for example, 1 mol %).

As the glass composition described in (4), it is possible to use, for example, a glass composition where the content of $SiO_2$ falls within a range of 53 mol % to 73 mol % (for example, 63.2 mol %), the content of $Al_2O_3$ falls within a range of 11 mol % to 21 mol % (for example, 15.5 mol %), the content of MgO falls within a range of 11 mol % to 21 mol % (for example, 15.7 mol %), and the content of CaO falls within a range of 3 mol % to 6 mol % (for example, 5.6 mol %).

Further, as the glass composition described in (5), it is possible to use, for example, a glass composition where the content of $SiO_2$ falls within a range of 40 mol % to 60 mol % (for example, 50 mol %), the content of $Al_2O_3$ falls within a range of 5 mol % to 15 mol % (for example, 10 mol %), and the content of ZnO falls within a range of 30 mol % to 50 mol % (for example, 40 mol %).

2. Advantageous Effect of Resin-Sealed Semiconductor Device

Figure 3A:
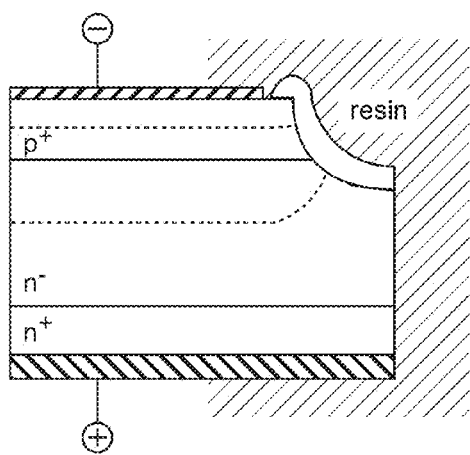
FIG. 3A and FIG. 3B are views for explaining an advantageous effect of the resin-sealed semiconductor device of the embodiment 1.
Figure 3B:
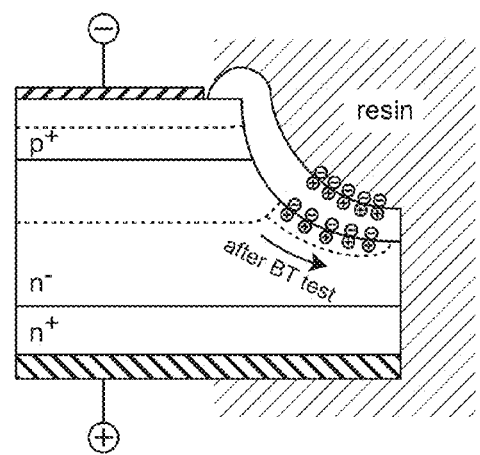

FIG. 3A and FIG. 3B are views for explaining an advantageous effect of the resin-sealed semiconductor device 10 of the embodiment 1. FIG. 3A is a view showing a state where a reverse voltage is applied to the resin-sealed semiconductor device 10 of the embodiment 1, and FIG. 3B is a view showing a state where a reverse voltage is applied to a resin-sealed semiconductor device of a comparison example. In FIG. 3A and FIG. 3B, a broken line indicates a distal end portion of a depletion layer. The resin-sealed semiconductor device of the comparison example is a resin-sealed semiconductor device formed by molding a conventional mesa-type semiconductor element 900 with a resin. In FIG. 3B, "AFTER BT TEST" means "after a high-temperature reverse bias test".

According to the resin-sealed semiconductor device 10 of the embodiment 1, the mesa-type semiconductor element 100 includes a glass layer made of lead-free glass (glass which contains no Pb) having a lower dielectric constant than lead-containing glass as the glass layer 124 and hence, there exists no possibility that ions of high concentration are induced on an interface between a molded resin and the glass layer as well as on an interface between the glass layer and a semiconductor layer in the midst of performing a high-temperature reverse bias test (see FIG. 3A) different from the case of the resin-sealed semiconductor device of the comparison example (see FIG. 3B). As a result, an amount of a leakage current which is increased during the high-temperature reverse bias test can be decreased compared to the prior art.

As a result, the resin-sealed semiconductor device 10 of the embodiment 1 can acquire higher resistance to a reverse bias at a high temperature than the conventional resin-sealed semiconductor device, although the resin-sealed semiconductor device 10 of the embodiment 1 has the structure where the mesa-type semiconductor element is molded with a resin in the same manner as the conventional resin-sealed semiconductor device. That is, the resin-sealed semiconductor device 10 of the embodiment 1 is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

3. Method of Manufacturing Resin-Sealed Semiconductor Device

The resin-sealed semiconductor device 10 of the embodiment 1 can be manufactured by the following method (method of manufacturing a resin-sealed semiconductor device of the embodiment 1).

FIG. 4A to FIG. 4D and FIG. 5A to FIG. 5D are views for explaining the method of manufacturing a resin-sealed semiconductor device of the embodiment 1. That is, FIG. 4A to FIG. 4D and FIG. 5A to FIG. 5D are views showing respective steps of the method of manufacturing a resin-sealed semiconductor device.

In the method of manufacturing a resin-sealed semiconductor device of the embodiment 1, as shown in FIG. 4A to FIG. 4D and FIG. 5A to FIG. 5D, "semiconductor substrate preparing step", "trench forming step", "glass layer forming step", "photoresist forming step", "oxide film removing step", "roughened surface region forming step", "electrode forming step", "semiconductor substrate cutting step", and "resin sealing step" are performed in this order. Hereinafter, the method of manufacturing a resin-sealed semiconductor device of the embodiment 1 is explained in the order of these steps.

(a) Semiconductor Substrate Preparing Step

Firstly, a $p^+$-type semiconductor layer 112 is formed by diffusion of a p-type impurity from one surface of an $n^-$-type semiconductor substrate ($n^-$-type silicon substrate) 110, and an $n^+$-type semiconductor layer 114 is formed by diffusion of an n-type impurity from the other surface of the $n^-$-type semiconductor substrate 110 thus forming a semiconductor substrate in which a pn junction arranged parallel to a main surface of the semiconductor substrate is formed. Thereafter, oxide films 116, 118 are formed by thermal oxidation on a surface of the $p^+$-type semiconductor layer 112 and a surface of the $n^+$-type semiconductor layer 114 respectively (see FIG. 4A).

(b) Trench Forming Step

Next, predetermined opening portions are formed on the oxide film 116 at predetermined positions by photo etching. After etching the oxide film, subsequently, the semiconductor substrate is etched thus forming trenches 120 having a depth exceeding the pn junction from one surface of the semiconductor substrate (see FIG. 4B).

(c) Glass Layer Forming Step

Figure 4A:
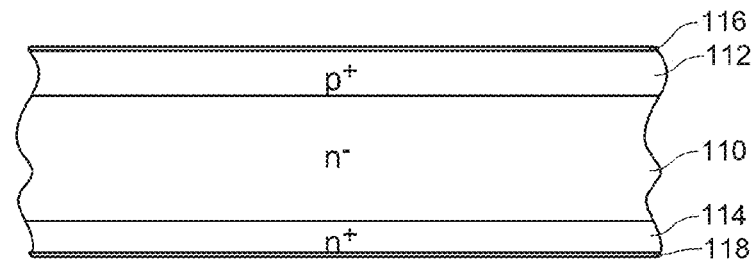
FIG. 4A to FIG. 4D are views for explaining a method of manufacturing a resin-sealed semiconductor device of the embodiment 1.
Figure 4B:
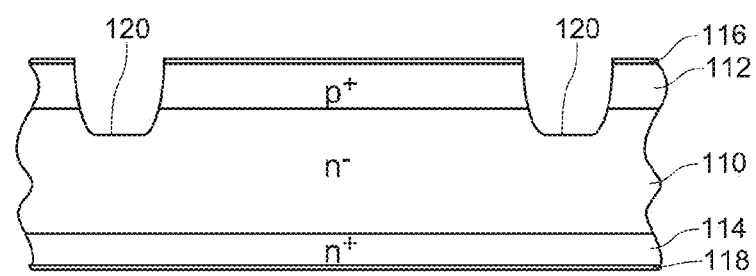
Figure 4C:
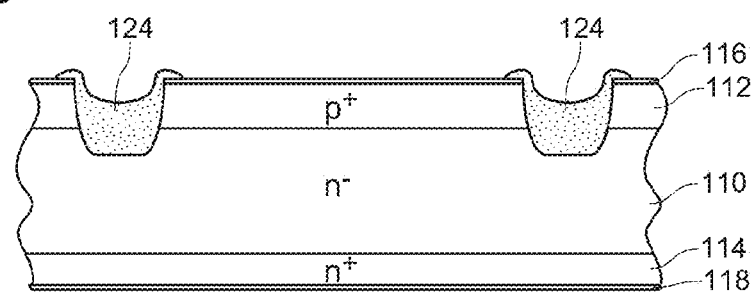

Next, a layer made of the glass composition is formed on inner surfaces of the trenches 120 and a surface of the semiconductor substrate in the vicinity of the trenches 120 by an electrophoresis method, and the layer made of the glass composition is baked so that the glass layer 124 for passivation is formed on the inner surfaces of the trenches 120 and the surface of the semiconductor substrate in the vicinity of the trenches 120 (see FIG. 4C). Accordingly, the pn junction exposure portion in the inside of the trench 120 is brought into a state where the pn junction exposure portion is directly covered with the glass layer 124. As the glass composition, various glass compositions which substantially contain no Pb can be used as described above.

(d) Photoresist Forming Step

Figure 4D:
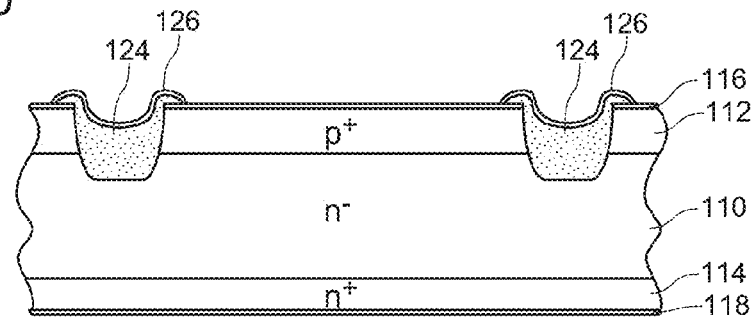

Next, a photoresist 126 is formed such that the photoresist 126 covers a surface of the glass layer 124 (see FIG. 4D).

(e) Oxide Film Removing Step

Figure 5A:
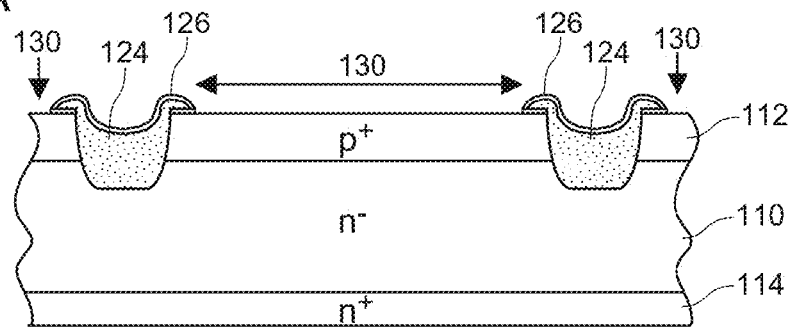
FIG. 5A to FIG. 5D are views for explaining the method of manufacturing a resin-sealed semiconductor device of the embodiment 1.

Next, the oxide film 116 is etched using the photoresist 126 as a mask so that the oxide film 116 at a position 130 where an Ni plating electrode film is to be formed is removed (see FIG. 5A).

(f) Roughened Surface Region Forming Step

Figure 5B:
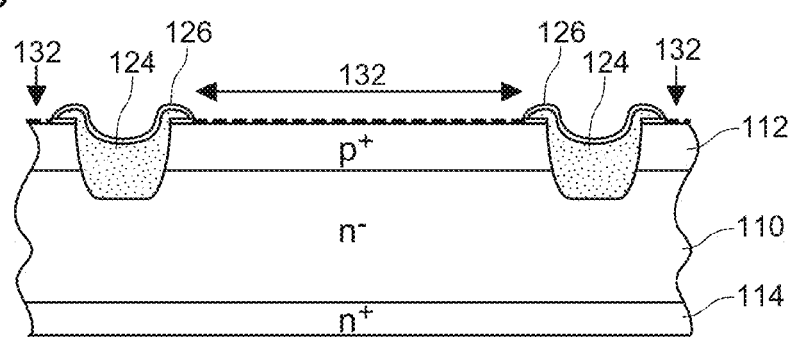

Next, a surface of the semiconductor base body at the position 130 where the Ni-plating electrode film is to be formed is subjected to surface roughening treatment thus forming a roughened surface region 132 for enhancing adhesiveness between an Ni plating electrode and the semiconductor substrate (see FIG. 5B).

(g) Electrode Forming Step

Figure 5C:
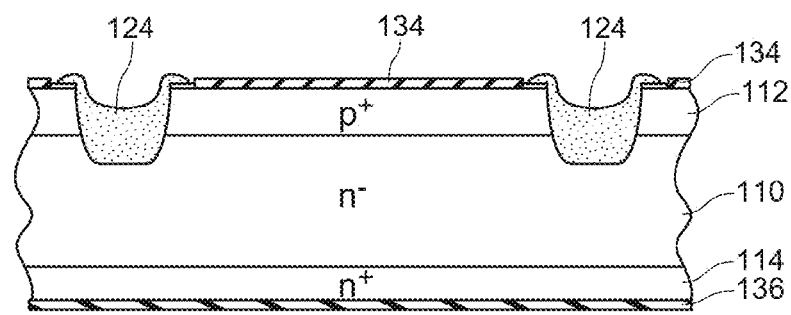

Next, Ni plating is applied to the semiconductor substrate thus forming an anode electrode 134 on the roughened surface region 132 and forming a cathode electrode 136 on the other surface of the semiconductor substrate (see FIG. 5C).

(h) Semiconductor Substrate Cutting Step

Figure 5D:
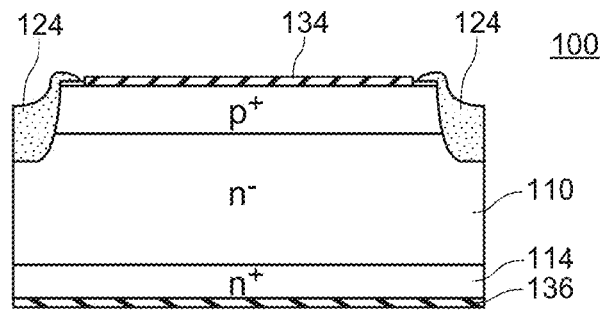

Next, the semiconductor substrate is cut by dicing or the like at a center portion of the glass layer 124 thus dividing the semiconductor substrate into chips whereby mesa-type semiconductor elements (pn diodes) 100 are manufactured (see FIG. 5D).

(i) Resin Sealing Step

Next, the mesa-type semiconductor element 100 is mounted on a die pad 23 of a lead frame not shown in the drawing (see FIG. 1). One electrode of the mesa-type semiconductor element 100 and a lead 21 are connected to each other, while the other electrode of the mesa-type semiconductor element 100 and a lead 22 are connected to each other by a gold wire 30. Then, these parts are arranged in a resin sealing die not shown in the drawing and, thereafter, a molding resin is injected into the inside of the die and is cured thus manufacturing a resin-sealed semiconductor device. The resin-sealed semiconductor device 10 of the embodiment 1 can be obtained by taking out the resin-sealed semiconductor device from the die.

Through the above-mentioned steps, the resin-sealed semiconductor device 10 of the embodiment 1 can be manufactured.

Embodiment 2

Figure 6:
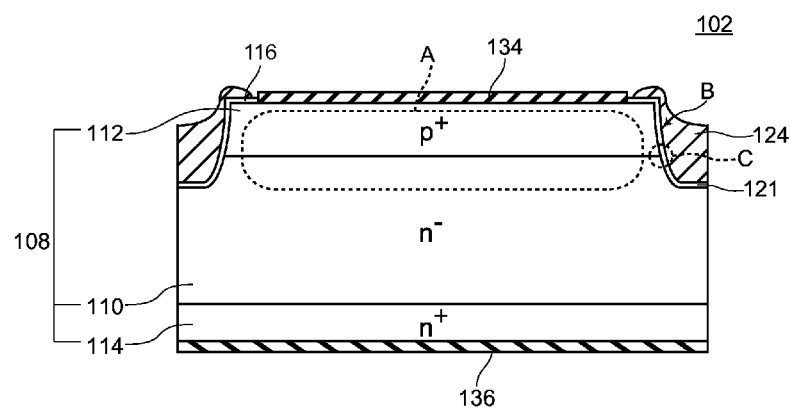
FIG. 6 is a view for explaining a mesa-type semiconductor element of an embodiment 2.

FIG. 6 is a view for explaining a mesa-type semiconductor element 102 of an embodiment 2.

A resin-sealed semiconductor device of the embodiment basically has the substantially same constitution as the resin-sealed semiconductor device 10 of the embodiment 1. However, the resin-sealed semiconductor device of the embodiment 2 differs from the resin-sealed semiconductor device 10 of the embodiment 1 with respect to the constitution of the mesa-type semiconductor element. That is, in the mesa-type semiconductor element 102 of the embodiment 2, as shown in FIG. 6, an outer peripheral tapered region B is covered with a glass layer 124 with an insulation layer 121 interposed therebetween.

As described above, the resin-sealed semiconductor device of the embodiment 2 differs from the resin-sealed semiconductor device 10 of the embodiment 1 with respect to the constitution of the mesa-type semiconductor element. However, in the same manner as the resin-sealed semiconductor device 10 of the embodiment 1, the mesa-type semiconductor element 102 includes a glass layer made of lead-free glass (glass which contains no Pb) having a lower dielectric constant than lead-containing glass as the glass layer 124 and hence, there exists no possibility that ions of high concentration are induced on an interface between a molded resin and the glass layer as well as on an interface between the glass layer and a semiconductor layer in the midst of performing a high-temperature reverse bias test whereby, as a result, a leakage current which is increased during the high-temperature reverse bias test can be decreased compared to the prior art.

As a result, the resin-sealed semiconductor device of the embodiment 2 can acquire higher resistance to a reverse bias at a high temperature than the conventional resin-sealed semiconductor device, although the resin-sealed semiconductor device of the embodiment 2 has the structure where the mesa-type semiconductor element is molded with a resin in the same manner as the conventional resin-sealed semiconductor device. That is, the resin-sealed semiconductor device of the embodiment 2 is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

According to the resin-sealed semiconductor device of the embodiment 2, the outer peripheral tapered region B is covered with the glass layer 124 with the insulation layer 121 interposed therebetween. Accordingly, it is also possible to acquire an advantageous effect that bubbles are hardly generated in a sintering step and an advantageous effect that a reverse leakage current in the resin-sealed semiconductor device can be further decreased.

The resin-sealed semiconductor device of the embodiment 2 can be manufactured by the following method (method of manufacturing a resin-sealed semiconductor device of the embodiment 2).

FIG. 7A to FIG. 7D and FIG. 8A to FIG. 8D are views for explaining the method of manufacturing a resin-sealed semiconductor device of the embodiment 2. That is, FIG. 7A to FIG. 7D and FIG. 8A to FIG. 8D are views showing respective steps of the method of manufacturing a resin-sealed semiconductor device.

In the method of manufacturing a resin-sealed semiconductor device of the embodiment 2, as shown in FIG. 7A to FIG. 7D and FIG. 8A to FIG. 8D, "semiconductor substrate preparing step", "trench forming step", "insulation layer forming step", "glass layer forming step", "photoresist forming step", "oxide film removing step", "roughened surface region forming step", "electrode forming step", "semiconductor substrate cutting step", and "resin sealing step" are performed in this order. Hereinafter, the method of manufacturing a resin-sealed semiconductor device of the embodiment 2 is explained in the order of these steps.

(a) Semiconductor Substrate Preparing Step

Firstly, a $p^+$-type semiconductor layer 112 is formed by diffusion of a p-type impurity from one surface of an $n^-$-type semiconductor substrate ($n^-$-type silicon substrate) 110, and an $n^+$-type semiconductor layer 114 is formed by diffusion of an n-type impurity from the other surface of the $n^-$-type semiconductor substrate 110 thus forming a semiconductor substrate in which a pn junction arranged parallel to a main surface of the semiconductor substrate is formed. Thereafter, oxide films 116, 118 are formed by thermal oxidation on a surface of the $p^+$-type semiconductor layer 112 and a surface of the $n^+$-type semiconductor layer 114 respectively.

(b) Trench Forming Step

Next, predetermined opening portions are formed on the oxide film 116 at predetermined positions by photo etching. After etching the oxide film, subsequently, the semiconductor substrate is etched thus forming trenches 120 having a depth exceeding the pn junction from one surface of the semiconductor substrate (see FIG. 7A).

(c) Insulation Layer Forming Step

Figure 7A:
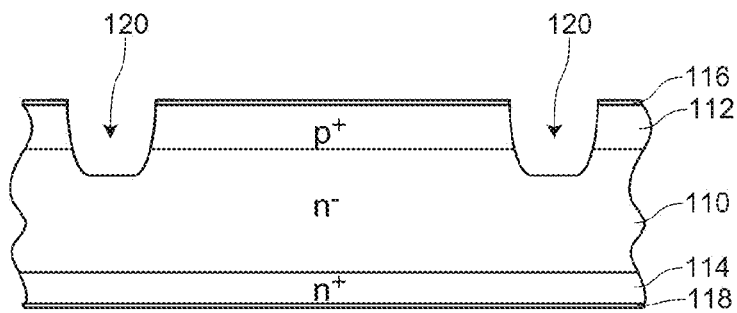
FIG. 7A to FIG. 7D are views for explaining a method of manufacturing a resin-sealed semiconductor device of the embodiment 2.
Figure 7B:
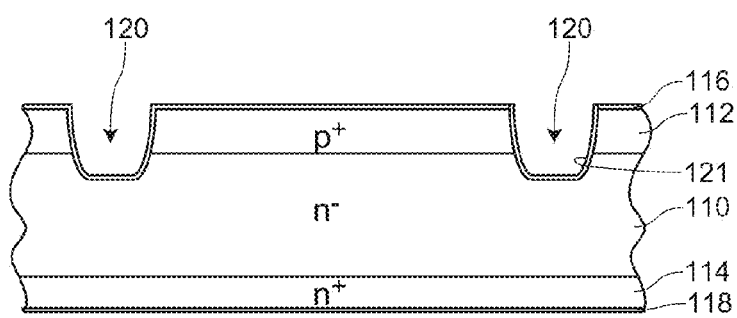

Next, an insulation layer 121 formed of a silicon oxide film is formed on inner surfaces of the trenches 120 by a thermal oxidation method using dry oxygen ($DryO_2$) (see FIG. 7B). A thickness of the insulation layer 121 is set to a value which falls within a range of 5 nm to 60 nm (20 nm, for example). The insulation layer is formed such that a semiconductor base body is introduced into a diffusion furnace and, thereafter, thermal oxidation treatment is performed at a temperature of 900° C. for 10 minutes while supplying an oxygen gas into the diffusion furnace. When the thickness of the insulation layer 121 is less than 5 nm, there may be a case where a reverse current reduction effect cannot be acquired. On the other hand, when the thickness of the insulation layer 121 exceeds 60 nm, there may be a case where a layer made of a glass composition cannot be formed by an electrophoresis method in a next glass layer forming step.

(d) Glass Layer Forming Step

Figure 7C:
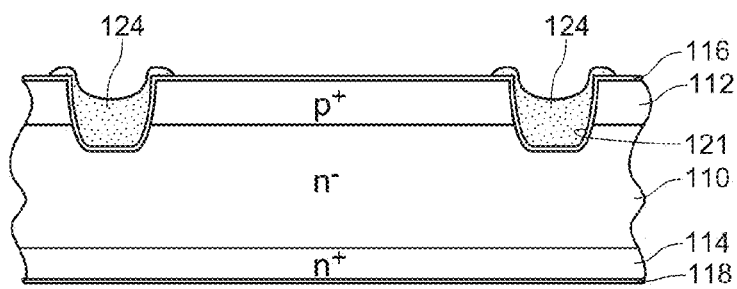

Next, a layer made of the glass composition is formed on inner surfaces of the trenches 120 and a surface of the semiconductor substrate in the vicinity of the trenches 120 by an electrophoresis method, and the layer made of the glass composition is baked so that the glass layer 124 for passivation is formed on the inner surfaces of the trenches 120 and the surface of the semiconductor substrate in the vicinity of the trenches 120 (see FIG. 7C). Here, in forming the layer made of the glass composition on the inner surfaces of the trenches 120, the layer made of the glass composition is formed such that the layer covers the inner surface of the trench 120 with the insulation layer 121 interposed therebetween. Accordingly, the pn junction exposure portion in the trench 120 is brought into a state where the pn junction exposure portion is covered with the glass layer 124 with the insulation layer 121 interposed therebetween.

(e) Photoresist Forming Step

Figure 7D:
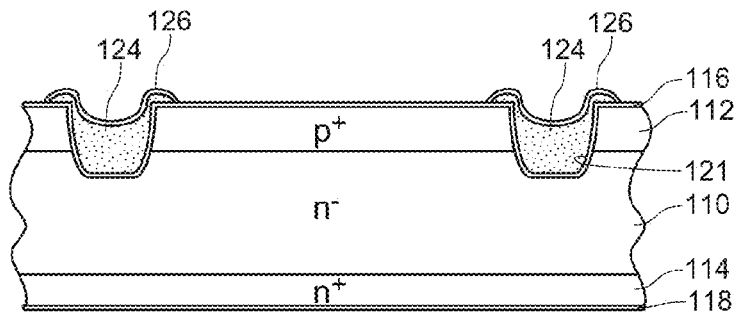

Next, a photoresist 126 is formed such that the photoresist 126 covers a surface of the glass layer 124 (see FIG. 7D).

(f) Oxide Film Removing Step

Figure 8A:
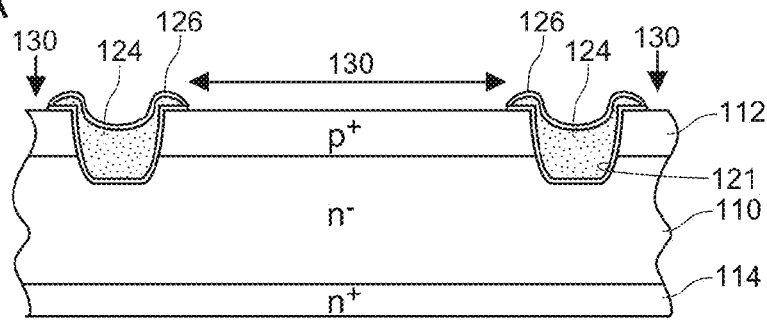
FIG. 8A to FIG. 8D are views for explaining a method of manufacturing a resin-sealed semiconductor device of the embodiment 2.

Next, the oxide film 116 is etched using the photoresist 126 as a mask so that the oxide film 116 at a position 130 where an Ni plating electrode film is to be formed is removed (see FIG. 8A).

(g) Roughened Surface Region Forming Step

Figure 8B:
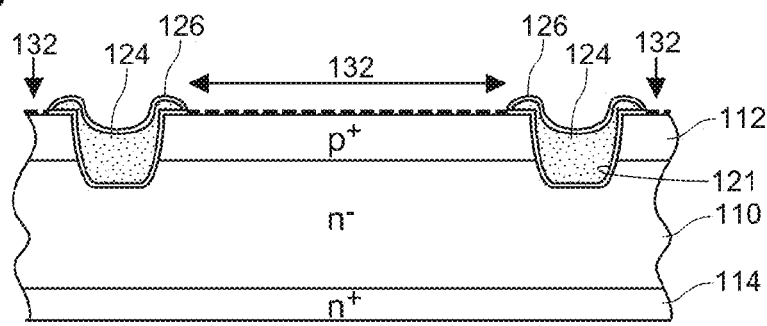

Next, a surface of the semiconductor substrate at the position 130 where the Ni-plating electrode film is to be formed is subjected to surface roughening treatment thus forming a roughened surface region 132 for enhancing adhesiveness between an Ni plating electrode and the semiconductor substrate (see FIG. 8B).

(h) Electrode Forming Step

Figure 8C:
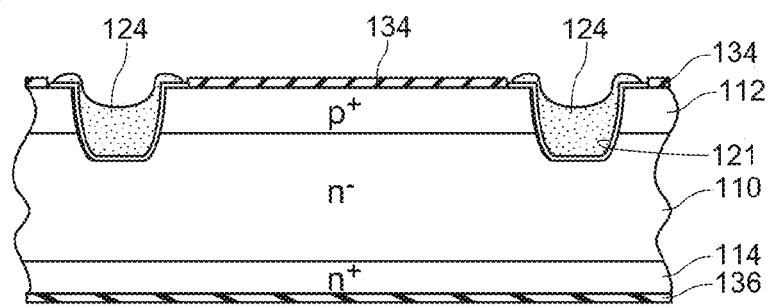

Next, Ni plating is applied to the semiconductor substrate thus forming an anode electrode 134 on the roughened surface region 132 and forming a cathode electrode 136 on the other surface of the semiconductor substrate (see FIG. 8C).

(i) Semiconductor Substrate Cutting Step

Figure 8D:
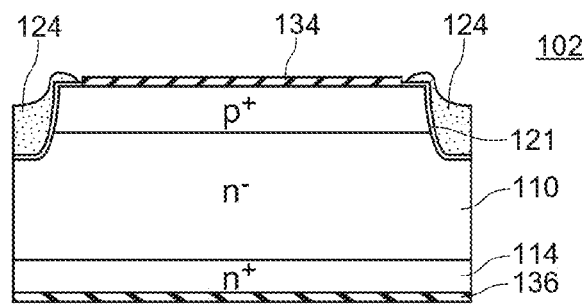

Next, the semiconductor substrate is cut by dicing or the like at a center portion of the glass layer 124 thus dividing the semiconductor base body into chips whereby mesa-type semiconductor elements (pn diodes) 102 are manufactured (see FIG. 8D).

(j) Resin Sealing Step

Next, the mesa-type semiconductor element 102 is mounted on a die pad 23 of a lead frame not shown in the drawing (see FIG. 1). One electrode of the mesa-type semiconductor element 102 and a lead 21 are connected to each other, while the other electrode of the mesa-type semiconductor element 102 and a lead 22 are connected to each other by a gold wire 30. Then, these parts are arranged in a resin sealing die not shown in the drawing and, thereafter, a molding resin is injected into the inside of the die and is cured thus manufacturing a resin-sealed semiconductor device. The resin-sealed semiconductor device of the embodiment 2 can be obtained by taking out the resin-sealed semiconductor device from the die.

Through the above-mentioned steps, the resin-sealed semiconductor device of the embodiment 2 can be manufactured.

Examples

1. Preparation of Samples

FIG. 9 is a Table showing conditions and results of examples. Raw materials are prepared at composition ratios indicated in examples 1 to 8 and comparison examples 1 and 2 (see FIG. 9). The raw materials are sufficiently mixed and stirred together by a mixer and, thereafter, the mixed raw material is put into a platinum crucible and is melted in an electric furnace by elevating the temperature to a predetermined temperature (1350° C. to 1550° C.) and is held in a molten state for two hours. Then, the material in a molten state is made to flow out from the crucible and is fed to water-cooled rolls so that glass flakes in a flaky shape are obtained. The glass flakes are pulverized by a ball mill until the glass flakes obtain an average particle size of 5 mm thus obtaining powdery glass composition.

The raw materials used in the examples are $SiO_2$, $H_3BO_3$, $Al_2O_3$, ZnO, $CaCO_3$, MgO, $BaCO_3$, NiO and PbO.

The respective glass compositions obtained by the above-mentioned methods are evaluated in accordance with the following evaluation aspects.

(1) Evaluation Aspect 1 (Baking Temperature)

When the baking temperature is excessively high, the baking temperature largely influences a semiconductor device in a manufacturing process. Accordingly, the score "good" is given when a baking temperature is 1100° C. or below, and the score "bad" is given when the baking temperature exceeds 1100° C.

(2) Evaluation Aspect 2 (Resistance to Chemicals)

The score "good" is given when the glass composition exhibits insolubility to both aqua regia and a plating liquid, and the score "bad" is given when the glass composition exhibits solubility to at least one of aqua regia and a plating liquid.

(3) Evaluation Aspect 3 (Average Linear Expansion Coefficient)

Glass plates in a flaky shape are prepared from a material in a molten state obtained in the above-mentioned "1. Preparation of samples", and an average linear expansion coefficient of the glass composition at a temperature of 50° C. to 550° C. is measured by using the glass plates in a flaky shape. The average linear expansion coefficient is measured by a total expansion measuring method (temperature elevation speed: 10° C./min) using Thermomechanical Analyzers TMA-60 made by SHIMADZU CORP where silicon single crystal having a length of 20 mm is used as a standard sample. As the result, the score "good" is given when the difference between the average linear expansion coefficient of the glass composition within a temperature range of 50° C. to 550° C. and the linear expansion coefficient ($3.73 \cdot 10^{-6}$) of silicon within a temperature range of 50° C. to 550° C. is equal to or below "$0.7 \cdot 10^{-6}$", and the score "bad" is given when such difference exceeds "$0.7 \cdot 10^{-6}$".

(4) Evaluation Aspect 4 (Insulation Property)

A mesa-type semiconductor element is manufactured by the same method as the method of manufacturing a resin-sealed semiconductor device of the embodiment 1, and a reverse breakdown voltage characteristic of the manufactured mesa-type semiconductor element is measured. As the result, the score "good" is given when a reverse breakdown voltage characteristic of the mesa-type semiconductor element falls within a normal range, and the score "bad" is given when a reverse breakdown voltage characteristic of a mesa-type semiconductor element falls outside a normal range.

(5) Evaluation Aspect 5 (Presence or Non-Presence of Crystallization)

In a step of manufacturing a semiconductor device (pn diode) by a method substantially equal to the method of manufacturing a semiconductor device of the embodiment 4, the score "good" is given when vitrification can be performed without causing the crystallization of the glass composition, and the score "bad" is given when vitrification cannot be performed due to the crystallization.

(6) Evaluation Aspect 6 (Presence or Non-Presence of Generation of Bubbles)

A mesa-type semiconductor element is manufactured by a method substantially equal to the method of manufacturing a resin-sealed semiconductor device of the embodiment 1, and the observation is made whether or not bubbles are generated in the inside of the glass layer 124 (particularly, in the vicinity of an interface between the silicon substrate and the glass layer 124) (preliminary evaluation). Then, layers made of glass compositions are formed by applying the glass compositions of the examples 1 to 8 and the comparison examples 1 to 2 to silicon substrates having a size of 10 mm×10 mm and glass layers are formed by baking the layers made of the glass compositions. Thereafter, the observation is made whether or not bubbles are generated in the inside of the glass layers (particularly, in the vicinity of an interface between the silicon substrate and the glass layer) (subsequent evaluation).

Figure 10A:
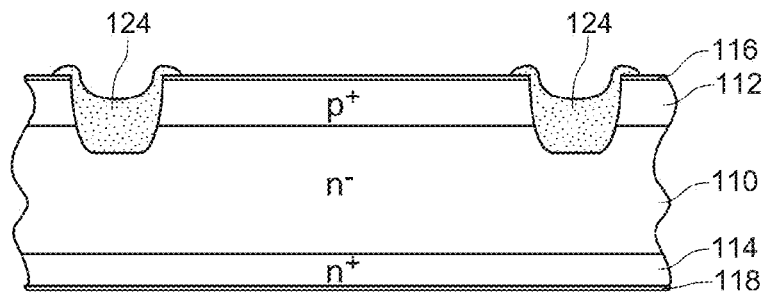
FIG. 10A and FIG. 10B are views for explaining bubbles generated in the inside of a glass layer in a preliminary evaluation.
Figure 10B:
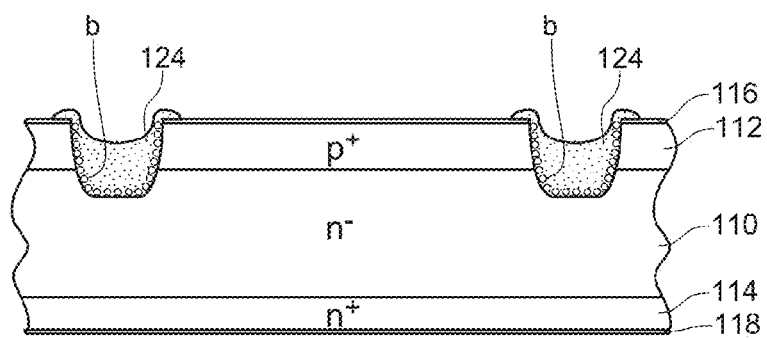
Figure 11A:
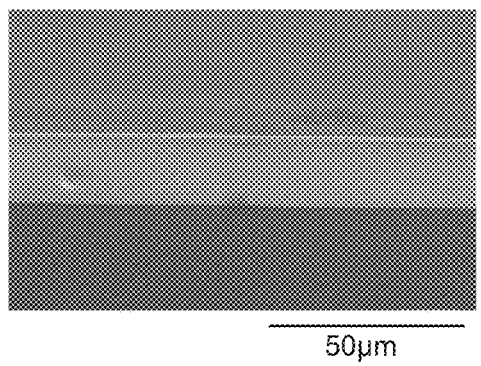
FIG. 11A and FIG. 11B are photographs for explaining bubbles generated in the inside of a glass layer in a subsequent evaluation.
Figure 11B:
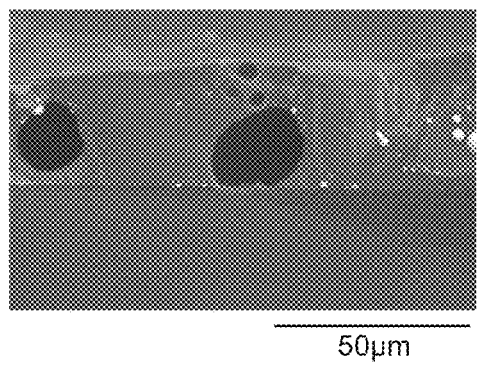

FIG. 10A and FIG. 10B are views for explaining bubbles "b" generated in the inside of the glass layer 124 in the preliminary evaluation. FIG. 10A is a cross-sectional view of a semiconductor device when no bubbles b are generated, while FIG. 10B is a cross-sectional view of a semiconductor device when bubbles b are generated. FIG. 11A and FIG. 11B are photographs for explaining bubbles b generated in the inside of the glass layer 124 in the subsequent evaluation. FIG. 11A is a photograph showing an interface between the silicon substrate and the glass layer when no bubbles b are generated in an enlarged manner, and FIG. 11B is a photograph showing an interface between the silicon substrate and the glass layer when bubbles b are generated in an enlarged manner. As the result of the experiment, it is found that there is enough correlation between the result of the preliminary evaluation and the result of the evaluation of the present invention. In the subsequent evaluation, the score "good" is given when no bubbles having a diameter of 50·m or more are generated in the inside of the glass layer, the score "fair" is given when one to twenty bubbles having a diameter of 50·m or more are generated in the inside of the glass layer, and the score "bad" is given when twenty one or more bubbles having a diameter of 50·m or more are generated in the inside of the glass layer.

(7) Evaluation Aspect 7 (Resistance to Reverse Bias at High Temperature)

A resin-sealed semiconductor device is manufactured by a method substantially equal to the method of manufacturing a resin-sealed semiconductor device of the embodiment 1, a high-temperature reverse bias test is performed with respect to the manufactured resin-sealed semiconductor device, and a resistance to a reverse bias at a high temperature is measured. The high-temperature reverse bias test is performed by measuring a reverse current for 70 hours for every 10 minutes in a state where a sample is placed in a thermostatic-bath⊕high-temperature bias tester where a temperature condition is set to 150° C. and a voltage of 600V is applied between the anode electrode and the cathode electrode.

Figure 12:
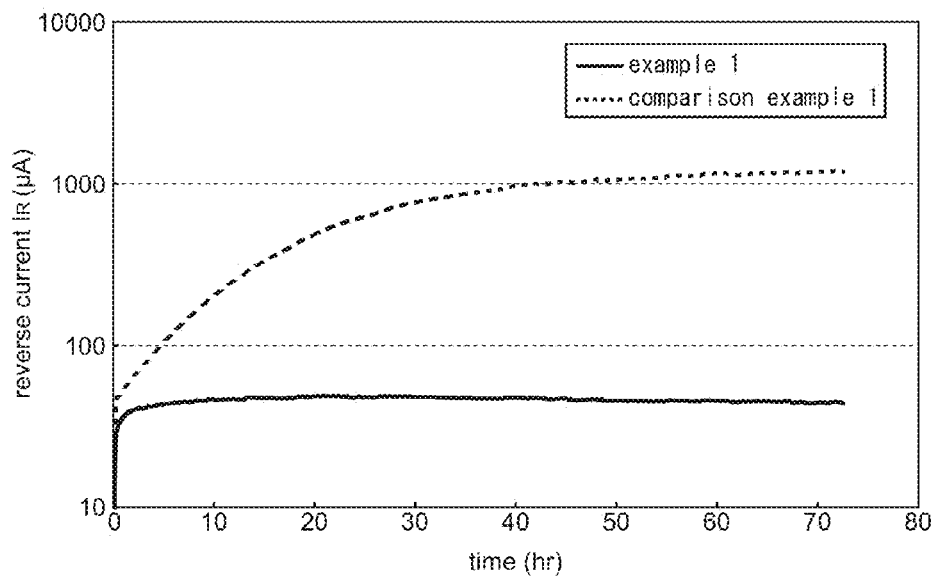
FIG. 12 is a graph showing the result of a high-temperature reverse bias test.

FIG. 12 is a graph showing the result of high-temperature reverse bias test. In FIG. 12, a solid line indicates a reverse current with respect to a sample prepared using the glass composition of the example 1, and a broken line indicates a reverse current with respect to a sample prepared using the glass composition of the comparison example 1. As shown in FIG. 12, with respect to the sample prepared using the glass composition of the comparison example 1, it is found that a leakage current (reverse current) is increased with the lapse of time even after the leakage current (reverse current) is increased along with the temperature elevation immediately after the high-temperature reverse bias test starts. To the contrary, with respect to the sample prepared using the glass composition of the example 1, it is found that a leakage current (reverse current) is hardly increased after the leakage current (reverse current) is increased along with the temperature elevation immediately after the high-temperature reverse bias test starts. As the result, the score "good" is given when a leakage current (reverse current) is hardly increased after the leakage current (reverse current) is increased along with the temperature elevation immediately after the high-temperature reverse bias test starts as described above, and the score "bad" is given when a leakage current (reverse current) is increased with the lapse of time even after the leakage current (reverse current) is increased along with the temperature elevation immediately after the high-temperature reverse bias test starts.

(8) Comprehensive Evaluation

The score "good" is given when the score "good" is given with respect to all of the above-mentioned evaluation aspects 1 to 7, and the score "bad" is given when the score "fair" or "bad" is given with respect to at least one of the respective evaluation aspects.

3. Evaluation Result

As can be understood also from FIG. 9, in all glass compositions according to the comparison examples 1 an 2, the score "bad" is given with respect to at least one of the evaluation aspects so that the score "bad" is given with respect to the comprehensive evaluation. That is, in the glass composition according to the comparison example 1, the score "bad" is given with respect to the evaluation aspect 7. Further, in the glass composition according to the comparison example 2, the score "bad" is given with respect to the evaluation aspect 2.

To the contrary, in all glass compositions according to the examples 1 to 8, the score "good" is given with respect to all evaluation aspects (evaluation aspects 1 to 7). As the result, it is found that, with respect to all glass compositions according to the examples 1 to 8, it is possible to manufacture a resin-sealed semiconductor device having higher resistance to a reverse bias at a high temperature than the conventional resin-sealed semiconductor device. It is also found that (1) the glass composition can be baked at a proper temperature (for example, 1100° C. or below), (2) the glass composition exhibits resistance to chemicals (aqua regia and a plating liquid, for example) used in a step, (3) the glass composition has a linear expansion coefficient close to a linear expansion coefficient of silicon (particularly an average linear expansion coefficient at a temperature range of 50° C. to 550° C. being close to a linear expansion coefficient of silicon) thus making warping of a wafer in a step extremely small, and (4) a manufactured glass layer has an excellent insulation property and hence, a resin-sealed semiconductor device having an excellent reverse breakdown voltage characteristic can be manufactured.

Although the resin-sealed semiconductor device, and the method of manufacturing a resin-sealed semiconductor device according to the present invention have been explained heretofore in conjunction with the above-mentioned embodiments, the present invention is not limited to the above-mentioned embodiments, and can be carried out without departing from the gist of the present invention. For example, the following modifications are conceivable.

(1) In the above-mentioned embodiments 1 and 2, although the glass layer is formed using the glass composition described in the embodiment 1, the present invention is not limited to such glass composition. For example, the glass layer may be formed using other glass compositions which substantially contain no Pb.

(2) In the above-mentioned embodiment 2, an insulation layer is formed by a thermal oxidation method using dry oxygen ($DryO_2$). However, the present invention is not limited to such an insulation layer. For example, an insulation layer may be formed by a thermal oxidation method using dry oxygen and nitrogen ($DryO_2+N_2$), an insulation layer may be formed by a thermal oxidation method using wet oxygen ($WetO_2$), or an insulation layer may be formed by a thermal oxidation method using wet oxygen and nitrogen ($wetO_2+1\%$).

(3) In the above-mentioned embodiments 1 and 2, the mesa-type semiconductor element which is constituted of a diode (pn diode) is used. However, the present invention is not limited to such embodiments. For example, a mesa-type semiconductor element constituted of a thyristor may be used. Further, besides the mesa-type semiconductor element constituted of a thyristor, the present invention is also applicable to semiconductor devices in general where a pn junction is exposed (for example, power MOSFET, IGBT and the like).

Figure 13:
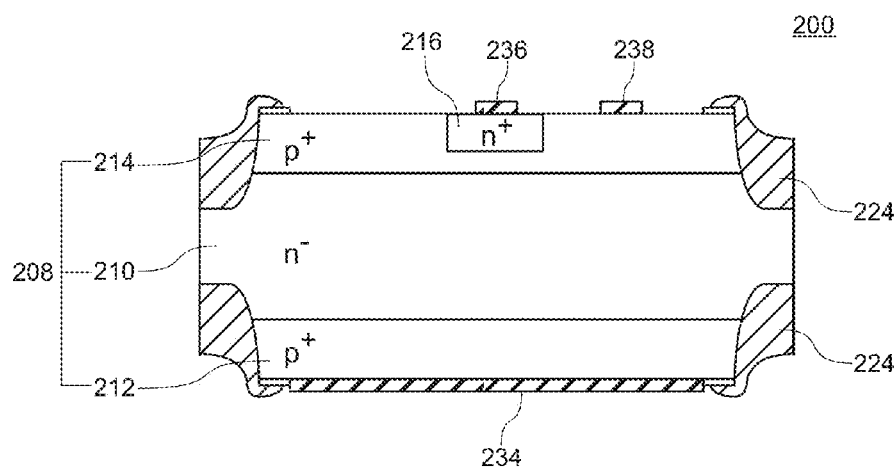
FIG. 13 is a view for explaining a mesa-type semiconductor element according to a modification.
Figure 14:
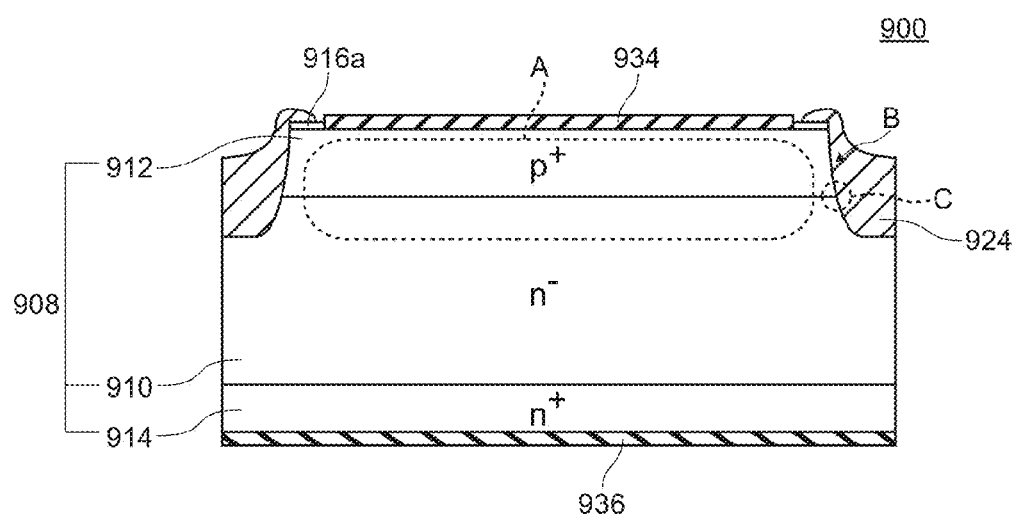
FIG. 14 is a view for explaining a conventional mesa-type semiconductor element.

FIG. 13 is a view for explaining a mesa-type semiconductor element 200 of a modification.

A resin-sealed semiconductor device of the modification basically has the substantially same constitution as the resin-sealed semiconductor device 10 of the embodiment 1. However, the resin-sealed semiconductor device of the modification differs from the resin-sealed semiconductor device 10 of the embodiment 1 with respect to a point that the resin-sealed semiconductor device uses a mesa-type semiconductor element constituted of a thyristor.

That is, the resin-sealed semiconductor device of the modification includes: a mesa-type semiconductor element 200 which includes a mesa-type semiconductor base body having a pn-junction exposure portion in an outer peripheral tapered region surrounding a mesa region, and a glass layer 224 which covers at least the outer peripheral tapered region; and a molding resin which seals the mesa-type semiconductor element 200, wherein the mesa-type semiconductor element 200 includes a glass layer which substantially contains no Pb as the glass layer 224.

The mesa-type semiconductor element 200 of the modification is formed of a thyristor. As shown in FIG. 13, the mesa-type semiconductor element 200 includes: a mesa-type semiconductor base body 208 an $n^-$-type semiconductor layer 210; a first $p^+$-type semiconductor layer 212 which is arranged in a state where the first $p^+$-type semiconductor layer 212 is brought into contact with the $n^-$-type semiconductor layer 210; a second $p^+$-type semiconductor layer 214 which is arranged in a state where the second $p^+$-type semiconductor layer 214 is brought into contact with the $n^-$-type semiconductor layer 210; an $n^+$-type semiconductor region 216 which is formed on a surface of the second $p^+$-type semiconductor layer 214; an anode electrode 234 which is connected to the first $p^+$-type semiconductor layer 212; a cathode electrode 236 which is connected to the $n^+$-type semiconductor region 216, and a gate electrode 238 which is connected to the second $p^+$-type semiconductor layer 214.

As described above, the resin-sealed semiconductor device of the modification differs from the resin-sealed semiconductor device 10 of the embodiment 1 with respect to a point that the resin-sealed semiconductor device uses the mesa-type semiconductor element formed of a thyristor. However, in the same manner as the resin-sealed semiconductor device 10 of the embodiment 1, the mesa-type semiconductor element includes a glass layer made of lead-free glass (glass which contains no Pb) having a lower dielectric constant than lead-containing glass as the glass layer. Accordingly, the resin-sealed semiconductor device of the modification can acquire higher resistance to a reverse bias at a high temperature than the conventional resin-sealed semiconductor device in the same manner as the resin-sealed semiconductor device 10 of the embodiment 1, although the resin-sealed semiconductor device of the modification has the structure where the mesa-type semiconductor element is molded with a resin in the same manner as the conventional resin-sealed semiconductor device. That is, the resin-sealed semiconductor device of the modification is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

EXPLANATION OF SYMBOLS

10: resin-sealed semiconductor device
20: lead frame
21, 22: lead
23: die pad
30: gold wire
40: resin
100, 102, 200: mesa-type semiconductor element
110, 910: $n^-$-type semiconductor layer
112, 912: $p^+$-type semiconductor layer
114, 914: $n^+$-type semiconductor layer
116, 118, 916, 918: oxide film
120, 920: trench
121: insulation film
124, 924: glass layer
126, 926: photoresist
130, 930: position where Ni plating electrode film is to be formed
132, 932: roughened surface region
134, 234, 934, 234: anode electrode
136, 236, 936: cathode electrode
210: $n^-$-type semiconductor layer
212: first $p^+$-type semiconductor layer
214: second $p^+$-type semiconductor layer
216: $n^+$-type semiconductor region
238: gate electrode layer

The invention claimed is:

1. A resin-sealed semiconductor device comprising:
a mesa-type semiconductor element which includes a mesa-type semiconductor base body having a pn-junction exposure portion in an outer peripheral tapered region which surrounds a mesa region, and a glass layer which covers at least the outer peripheral tapered region; and
a molding resin which seals the mesa-type semiconductor element,
wherein
the mesa-type semiconductor element includes, as the glass layer, a glass layer which is formed by baking a glass composition for protecting a semiconductor junction which is made of fine glass particles prepared from a material in a molten state,
the glass layer is formed using a glass composition which substantially contains none of Pb, P, As, Sb, Li, Na and K, the glass composition contains at least $SiO_2$, $Al_2O_3$, an oxide of alkaline earth metal, and the glass composition can be baked at 1100° C. or below, and (i) the content of $SiO_2$ falls within a range of 53 mol % to 73 mol %, the content of $Al_2O_3$ falls within a range of 11 mol % to 21 mol %, a content of CaO falls within a range of 3 mol % to 9 mol %, a content of MgO falls within a range of 11 mol % to 21 mol %, the content of nickel oxide falls within a range of 0.01 mol % to 3 mol %, or, (ii) the content of $SiO_2$ falls within a range of 32 mol % to 48 mol %, the content of $Al_2O_3$ falls within a range of 9 mol % to 13 mol %, the content of CaO falls within a range of 15 mol % to 23 mol %, a content of ZnO falls within a range of 18 mol % to 28 mol %, a content of $B_2O_3$ falls within a range of 3 mol % to 10 mol %, the content of nickel oxide falls within a range of 0.01 mol % to 3 mol %.

* * * * *